US007021977B2

(12) United States Patent
Andersen

(10) Patent No.: US 7,021,977 B2
(45) Date of Patent: Apr. 4, 2006

(54) FOUR-SIDED ELECTRICAL CONTACT

(76) Inventor: Stephen Andersen, 1460 Railroad Rd. - P.O. Box 957, Oceano, CA (US) 93445

( * ) Notice: Subject to any disclaimer, the term of this patent is extended or adjusted under 35 U.S.C. 154(b) by 0 days.

(21) Appl. No.: 10/890,577

(22) Filed: Jul. 13, 2004

(65) Prior Publication Data

US 2004/0259432 A1 Dec. 23, 2004

Related U.S. Application Data

(62) Division of application No. 10/305,340, filed on Nov. 25, 2002, now Pat. No. 6,761,054, which is a division of application No. 09/827,883, filed on Apr. 5, 2001, now Pat. No. 6,523,387.

(51) Int. Cl.
*H10R 4/02* (2006.01)

(52) U.S. Cl. .................................................... 439/857

(58) Field of Classification Search ................ 439/857, 439/856, 851, 825, 882; 72/326, 332, 324
See application file for complete search history.

(56) References Cited

U.S. PATENT DOCUMENTS 1,104,720 A * 7/1914 Turner ........................ 439/825
4,040,177 A * 8/1977 Beeler et al. ................. 29/882
4,909,763 A * 3/1990 Andersen ..................... 439/856
4,970,782 A * 11/1990 Andersen ...................... 29/874
5,024,610 A * 6/1991 French et al. ............... 439/857
5,564,952 A * 10/1996 Davis ......................... 439/682
6,102,754 A * 8/2000 Capper et al. .............. 439/857
6,652,322 B1 * 11/2003 Ito et al. ..................... 439/637
6,676,137 B1 * 1/2004 Dean .......................... 277/628

* cited by examiner

*Primary Examiner*—Gary F. Paumen
*Assistant Examiner*—Phuongchi Nguyen
(74) *Attorney, Agent, or Firm*—James E. Bruton, Esq.

(57) ABSTRACT

A method and apparatus for the precise manufacture of high quality, four-sided electrical contacts by means of a closely controlled material skiving process. The apparatus is designed so that the starting material from which the four-sided electrical contacts are made is closely constrained in the area of the shear boundaries so that predictable and precisely controlled shearing of the material can repeatedly be achieved to initially form four precursor sides, two of which are arcuate. The apparatus also includes sequentially operating forming mechanisms for precisely forming the precursor sides of the precursor contact into a final end product configuration.

5 Claims, 14 Drawing Sheets

FIG. 22
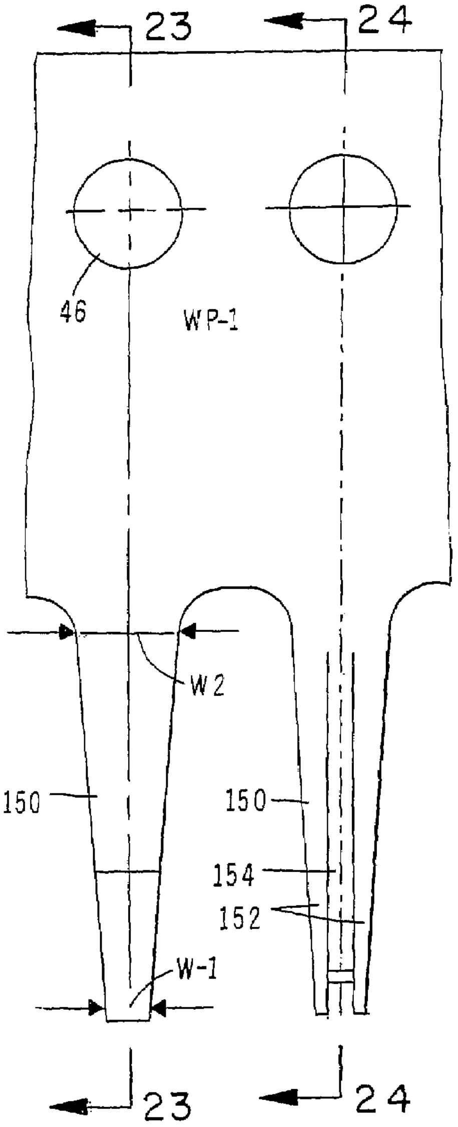
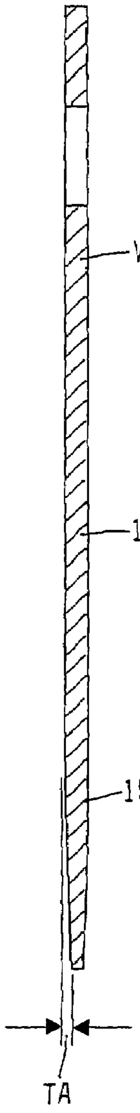
FIG. 23
FIG. 24
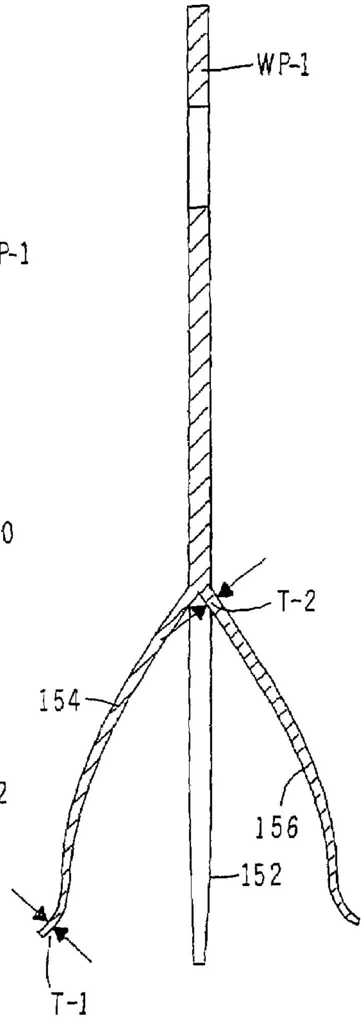

FOUR-SIDED ELECTRICAL CONTACT

This is a Divisional application of co-pending application Ser. No. 10/305,340 filed Nov. 25, 2002 which is a Divisional Application of Ser. No. 09/827,883 filed Apr. 5, 2001, now U.S. Pat. No. 6,523,387.

BACKGROUND OF THE INVENTION

1. Field of the Invention

The present invention relates generally to electrical contacts and to a method and apparatus for making the contacts. More particularly, the invention concerns a method and apparatus for making four sided electrical contacts of the character having specially configured, spaced apart spring like tines.

2. Discussion of the Invention

Fork like electrical contacts are well known in the art and are widely used in a number of different kinds of electrical applications. Typically, the prior art fork contact includes a pair of inwardly biased sides or tines that extend out from a base so that a member such as a pin contact may be inserted between the pair of sides to make an electrical connection therewith.

Because of the extensive use in industry of electrical contacts of the character described in the previous paragraph, various methods have been suggested in the past for the high volume manufacture of the electrical contacts. In one common prior art method the contact members are stamped or lanced from a suitable piece of sheet material and the contact tongues or tines are then formed or coined as necessary. Exemplary of such electrical contacts is those disclosed in U.S. Pat. No. 3,286,220 issued to Marley et al. and in U.S. Pat. No. 3,812,452 issued to Sturm.

Another prior art method of making electrical contacts involves the splitting of a bar of electrically conductive metal longitudinally over a portion of its length to form two contact tongues. Such a method is described in U.S. Pat. No. 4,040,177 issued to Beeler et al. In one form of the Beeler et al. method, a portion of the bar to be split is to be enclosed between two tools. The tools are then moved, sliding along each other perpendicular to the longitudinal dimension of the bar in mutually opposed directions over a distance which is sufficient to produce the desired splitting. In another method of splitting, the bar to be split is retained over its length such that one end is free to receive a wedge which is longitudinally driven into the bar through this free end.

Experience has shown that, in order to repeatedly produce precision electrical contacts by splitting or shearing the material, it is absolutely essential that the portion of the material immediately adjacent the boundary of the split or shear be rigidly and positively contained. Only in this way can a predictable controlled, precise split of the material be achieved.

An elegantly simple prior art method and apparatus for producing two sided precision electrical contacts by a shearing method is disclosed in U.S. Pat. Nos. 4,909,763 and 4,970,782 issued to the present inventor. In the practice of the methods disclosed in these patents, the starting material from which the electrical contacts are made is closely constrained within the area of the shear boundaries so that predictable and precisely controlled shearing of the material can be repeatably achieved with great accuracy. The present invention comprises an improvement upon the method and apparatus disclosed in U.S. Pat. No. 4,909,763 and in U.S.

Pat. No. 4,970,782 and, for this reason, these patents are hereby incorporated by reference as though fully set forth herein.

As will be better understood from the discussion which follows, the thrust of the present invention is to improve on the techniques described in the previously mentioned, incorporated by reference patents and in so doing to provide a method and apparatus for the high volume production of four sided electrical contacts from a starting material which comprises a plurality of spaced apart, pre-cut pins which are precisely split to form four, spaced apart tines or tongue like members. The apparatus of the present invention then forms these four tongue like members into precisely configured, four sided contacts.

SUMMARY OF THE INVENTION

It is an object of the present invention to provide a method and apparatus for the precise manufacture of high quality, four-sided electrical contacts by means of a closely controlled material skiving or splitting process. More particularly, it is an object of the invention to provide an apparatus of novel design for use in making the precision, four-sided electrical contacts wherein the starting material from which the electrical contacts are made is closely constrained in the area of the shear boundaries so that predictable and precisely controlled shearing of the material can repeatedly be achieved to initially form four precursor sides.

It is another object of the present invention to provide an apparatus for making four-sided electrical contacts of the aforementioned character in which the apparatus includes forming means for forming the precursor sides into a final, end product configuration.

Another object of the invention is to provide an apparatus of the character described in the preceding paragraphs which automatically performs the shearing and forming steps on a progressive basis.

Another object of the invention is to provide an apparatus of the class described which is of simple, straightforward design requiring a minimum amount of maintenance.

Still another object of the invention is to provide a method and apparatus of the character described in the preceding paragraphs which is easy to use by relatively unskilled workmen and has the ability to accomplish very high volume production rates.

BRIEF DESCRIPTION OF THE DRAWINGS

FIG. 22 is a generally diagrammatic, fragmentary top plan view similar to FIG. 17 but showing still another form of the method of the invention for shearing a tapered workpiece that also varies in width.

FIG. 23 is a cross-sectional view taken along lines 23—23 of FIG. 22 further showing the configuration of the tapered workpiece.

FIG. 24 is a cross-sectional view taken along lines 24—24 of FIG. 22 showing the appearance of the top and bottom tongues following the initial shearing of the tapered workpiece.

DESCRIPTION OF THE INVENTION

Figure 1:
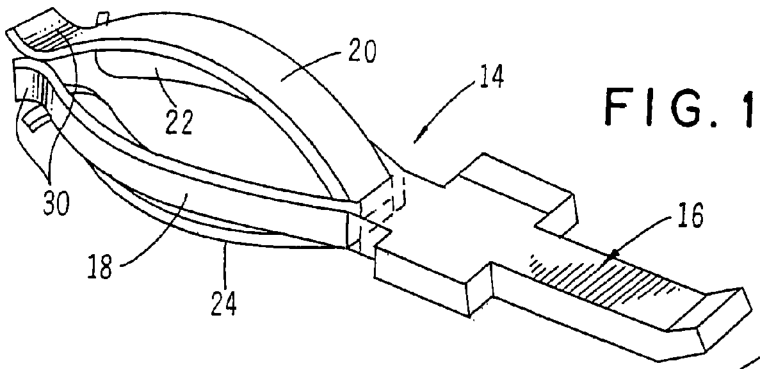
FIG. 1 is a generally perspective view of one form of the four sided electrical contact made in accordance with the method of the present invention.

Referring to the drawings and particularly to FIG. 1, one type of four sided electrical contact made in accordance with the method of the present invention is there illustrated and generally designated by the numeral 14. Contact 14 includes a stem portion 16 and four cooperating tongues 18, 20, 22 and 24 respectively. After being formed each of the four tongues of the electrical contact is generally arcuate in shape having one end integrally connected to the stem portion and the opposite, or free ends having an outwardly curved portion, generally designated in FIG. 1 by the numeral 30.

Figure 2:
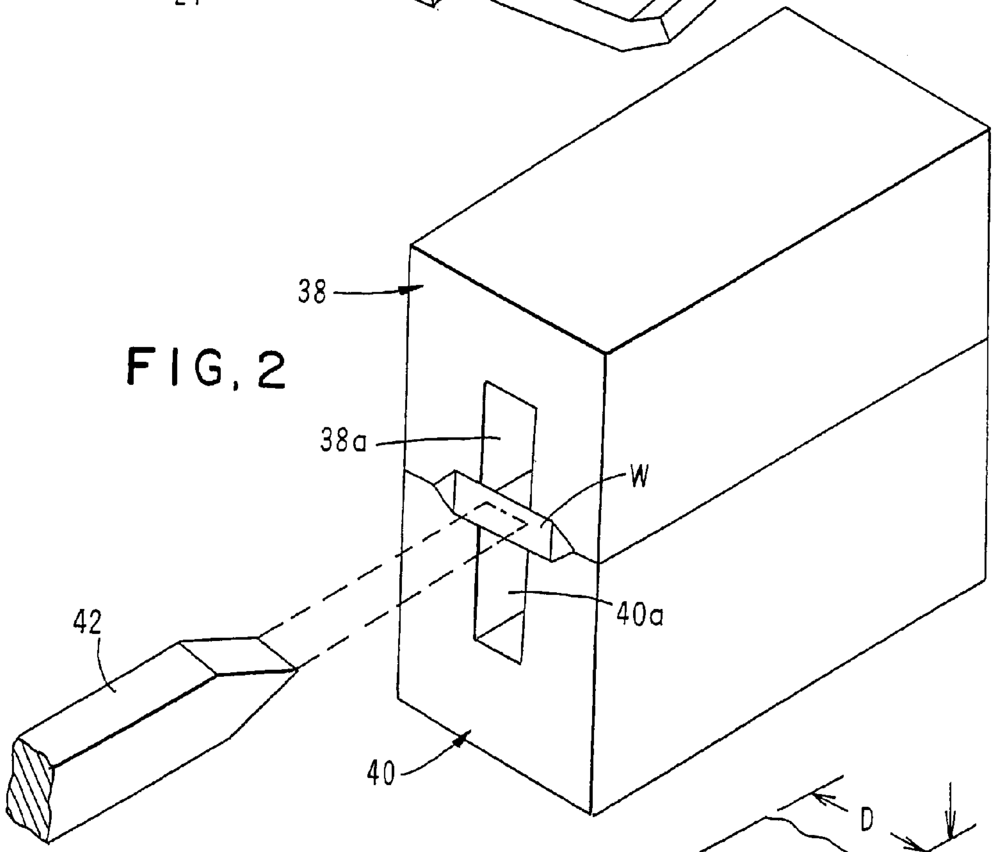
FIG. 2 is a generally perspective, illustrative view of a greatly simplified form of shearing mechanism.
Figure 2A:
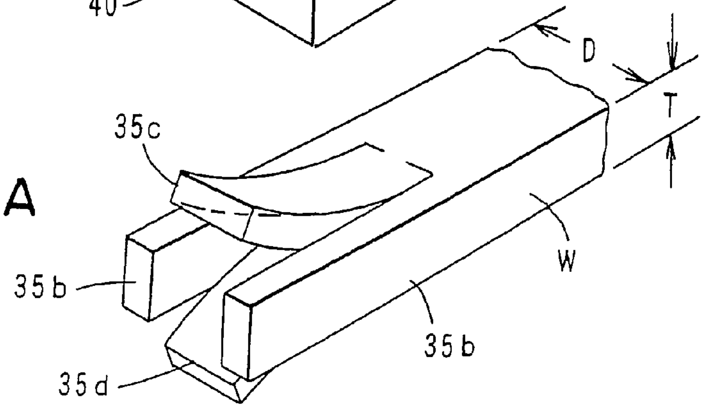
FIG. 2A is a generally perspective, exemplary view of the general type of precursor article produced using a shearing mechanism of the character depicted in FIG. 2.

Before discussing the various tongue forming and shaping steps of the method of the present invention that are required to form contact 14, a brief discussion of the basic shearing techniques of the invention is in order. In this regard, referring particularly to FIG. 2, a very basic type of shearing apparatus is there diagrammatically illustrated. Similarly, FIG. 2A shows a very basic form of precursor, four sided contact made using the apparatus shown in FIG. 2. As indicated in these figures, during the shearing step the workpiece "W" is secured within a clamping means here depicted as first and second cooperating clamping elements 38 and 40 (FIG. 2).

As more fully discussed in U.S. Pat. Nos. 4,909,763 and 4,970,762, which patents are incorporated herein by reference, clamping elements of the same general character there described are used to support the workpiece "W" as the splitting tool or punch element 42 advances toward the securely clamped workpiece. As depicted in FIG. 2, the workpiece "W" has a width greater than the width of channels 38*a* and 40*a* which are formed in elements 38 and 40 in the manner shown in the drawings.

As will be discussed in greater detail hereinafter, by precutting the workpiece to some desired width greater than the width of channels 38*a* and 40*a*, splitting of the workpiece by the shearing tool 42 (FIG. 2) will result in the simultaneous formation of the side tongues 35*b* and the top and bottom tongues 35*c* and 35*d* (see FIG. 2A). Because of the way in which the workpiece is split by the skiving tool, if the width of the workpiece is properly selected, the thickness of the side tongues will be approximately half the thickness of the starting workpiece. More particularly, it is to be appreciated that the width of the workpiece "W" must be carefully selected to be about twice the thickness of the workpiece "W" if all four contacts are to have the same cross-sectional dimensions. Therefore, by judiciously choosing the width of the workpiece in proportion to its thickness, the controlled splitting of the workpiece "W" will uniquely produce a precursor contact having four tongues of substantially the same cross-sectional dimensions.

Notwithstanding the foregoing, it is to be appreciated that for some end product applications, having all four tongues the same may not be required, or even desired. By way of example, if the workpiece "W" shown in FIG. 2A were to be made somewhat wider than the width "D", then the thickness of side tongues 35*b* would be greater than the thickness of top and bottom tongues 35*c* and 35*d*. If this were to be done, the stiffer side contacts could be used as locators in the resulting connector. In similar fashion, side tongues 35*b* could be formed so that one could compensate for the increased thickness of the side tongues by increasing the length of the lever arm. This would provide the added benefit of reducing the insertion force of the mating male contact.

As is also apparent from a study of FIG. 2A, the thickness of top and bottom tongues 35*c* and 35*d* is determined by the thickness "T" of the workpiece "W", while the width of the tongues is independent of the thickness of "W". On the other hand, the width of side tongues 35*b* is determined by the thickness of "W", and the thickness of the tongues and 35*b* is independent of the thickness of "W". Uniquely, the width of the side tongues is substantially equal to the thickness of the workpiece. Thus the cross-sectional dimensions of the four tongues are determined quite differently from one pair to the other. For example, on some occasions, it may be desirable to have the side tongues 35*b* thicker and longer than the top and bottom tongues. In this instance, the width of the starting workpiece would be adjusted accordingly to achieve the desired end result.

As discussed in much greater detail in U.S. Pat. No. 4,909,763, the imposition of the very high shearing on the workpiece caused by the shearing tool causes a novel burnishing effect to occur on either side of the apex of the punch. This burnishing action results in the formation of a remarkably fine finish on the sheared surfaces of the precursor electrical contact. In accordance with one form of the method of the present invention, as the shearing tool 42 advances into the channel within which the workpiece is clamped, burnished, precursor top and bottom tongues 35*c* and 35*d* will be precisely formed.

Figure 3:
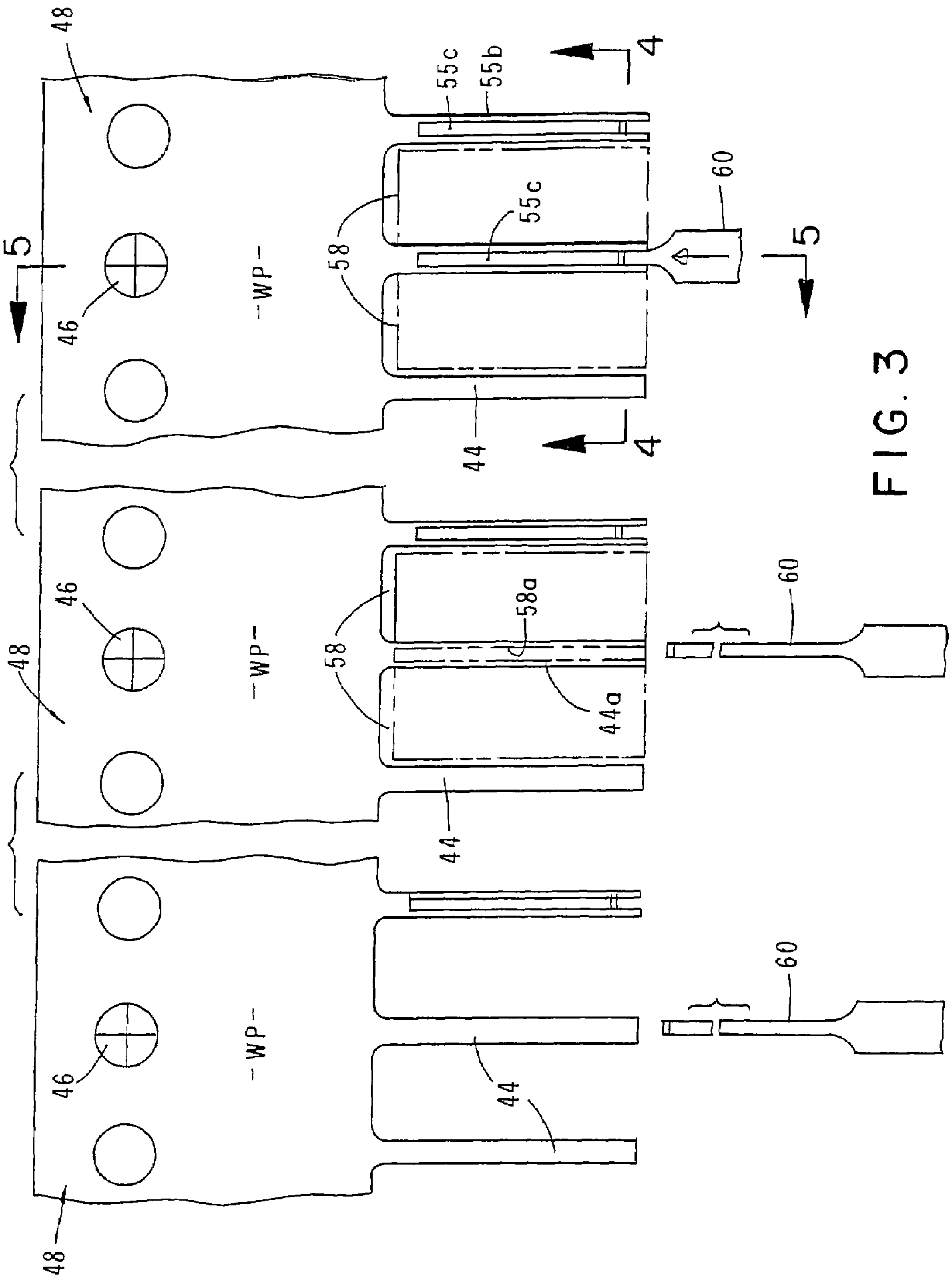
FIG. 3 is a top plan view of the shearing station of the apparatus of the invention and diagrammatically illustrates the initial steps in the method of the invention for shearing the starting workpieces to form the four sides of the precursor of the electrical contact of the general character shown in FIG. 2A.
Figure 7:
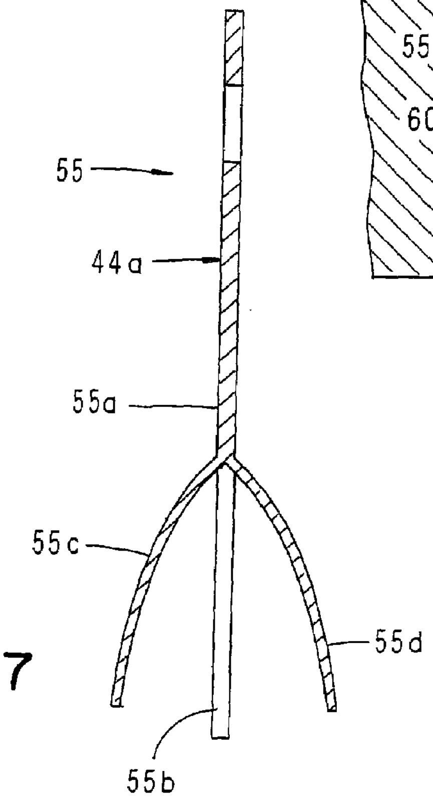
FIG. 7 is a cross-sectional view taken along lines 7—7 of FIG. 6 showing the configuration of the precursor article after formation of the top, bottom and side precursor tongues.

Referring now to FIGS. 3 through 7, one form of the method and apparatus of the present invention for making the electrical contact 14 is there illustrated. In this instance, the starting workpiece is provided in the form of an elongated strip of material having a plurality of outwardly extending fingers 44 (FIG. 3.) This starting workpiece, which is identified in FIG. 3 as "WP", is formed by a conventional blanking operation well known to those skilled in the art which produces an indexable work strip having a plurality of outwardly extending fingers 44. After the starting workpiece has been indexably positioned on the work surface of the apparatus using index pins 46, it is advanced to the shearing station, generally identified by the numeral 48, where the shearing step is accomplished. During this important shearing step, the fingers 44 are sequentially controllably sheared to produce four sided, precursor contacts 55 of the general configuration illustrated in FIGS. 5 and 7. After the shearing step, each individual precursor contact formed includes a stem portion 55a, which, at this stage is a part of strip "WP", spaced apart precursor side tongues 55*b* (FIG. 6), a precursor top tongue 55*c* and a precursor bottom tongue 55*d* (FIG. 7).

In a manner presently to be described, in using the apparatus of the present invention as generally depicted in FIGS. 3 through 13, the workpiece is controllably advanced to the right as seen in FIG. 3, first to the shearing work station 48 and then through several forming and shaping stations where the precursor tongues are strategically formed into their final shape.

At the shearing station, diagrammatically depicted in FIG. 3, a selected finger 44*a* is securely clamped in position by cooperating upper and lower clamping elements 58 which comprise a part of the support means of the apparatus of the invention. Each of the clamping elements is provided with a shearing tool receiving channel 58*a* which is of a width less than the width of fingers 44. With finger 44*a* securely clamped in place between the clamping elements in the manner shown in the central portion of FIG. 3, shearing means, here shown in the form of a shearing tool or punch 60, is advanced from the position shown in the central portion of FIG. 3 to a position shown in the right-hand portion in FIG. 3. As the shearing tool advances it will controllably shear the workpiece in a manner to form the precursor contact which includes precursor side tongues and precursor top and bottom tongues. More particularly, after the shearing tool has reached the position shown in FIG. 5, the four precursor tongues comprising a pair of precursor side tongues 55*b*, a top precursor tongue 55*c* and a bottom precursor tongue 55*d* will have been formed. As indicated in FIG. 7, after the shearing step the two precursor side tongues 55*b* and the precursor top and bottom tongues 55*c* and 55*d* respectively will have the general configuration shown. Following retraction of the shearing tool as illustrated in FIG. 6, the workpiece "WP" will be advanced to the right in a direction toward the first of several forming stations of the invention wherein the precursor tongues of the precursor contact will be shaped into their final configuration.

It is to be understood that as the precursor contact moves toward the first forming station of the apparatus, another finger 44 of the workpiece will automatically be moved into position to be securely clamped between upper and lower clamping elements 58 of the apparatus which are appropriately moved into position above and below on either side of the finger as the finger is moved into position within the shearing work station. Once the finger to be sheared is in position between the clamping elements and spanning the shearing tool receiving channels 58*a*, the shearing tool 60 can once again be advanced toward the securely clamped workpiece to controllably shear the central portion of the finger and thereby form the next precursor contact which will also have the general configuration shown in FIG. 7. The means for indexably advancing the workpiece, for positioning the clamping elements and for advancing and retracting the shearing tool are well understood by those skilled in the art and will not be discussed in detail herein.

Figure 4:
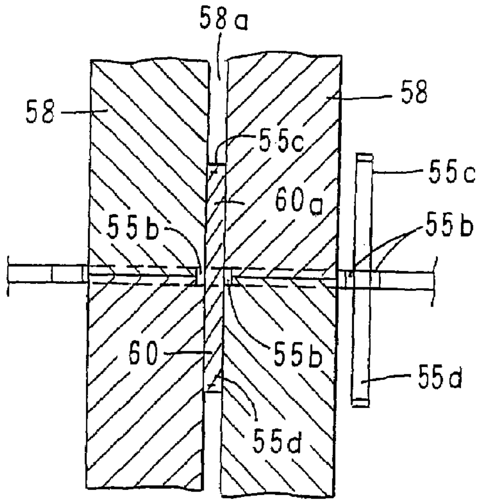
FIG. 4 is a cross-sectional view taken along lines 4—4 of FIG. 3 showing the shearing tool advanced into one of the die portions of the shearing mechanism provided at the shearing station.
Figure 5:
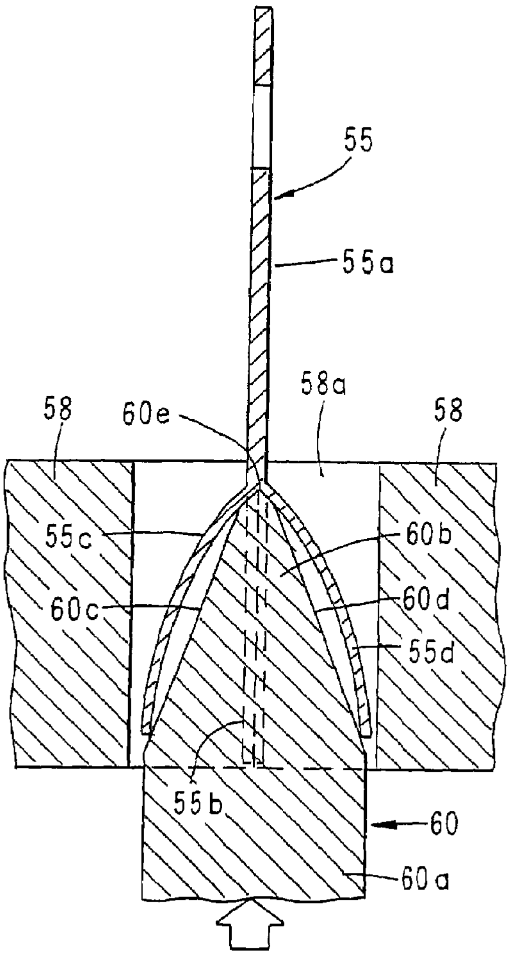
FIG. 5 is a cross-sectional view taken along lines 5—5 of FIG. 3 showing the appearance of the outwardly extending tongues of the precursor contact after the starting workpiece has been sheared by the forward advance of the shearing tool between the dies of the apparatus of the invention.
Figure 6:
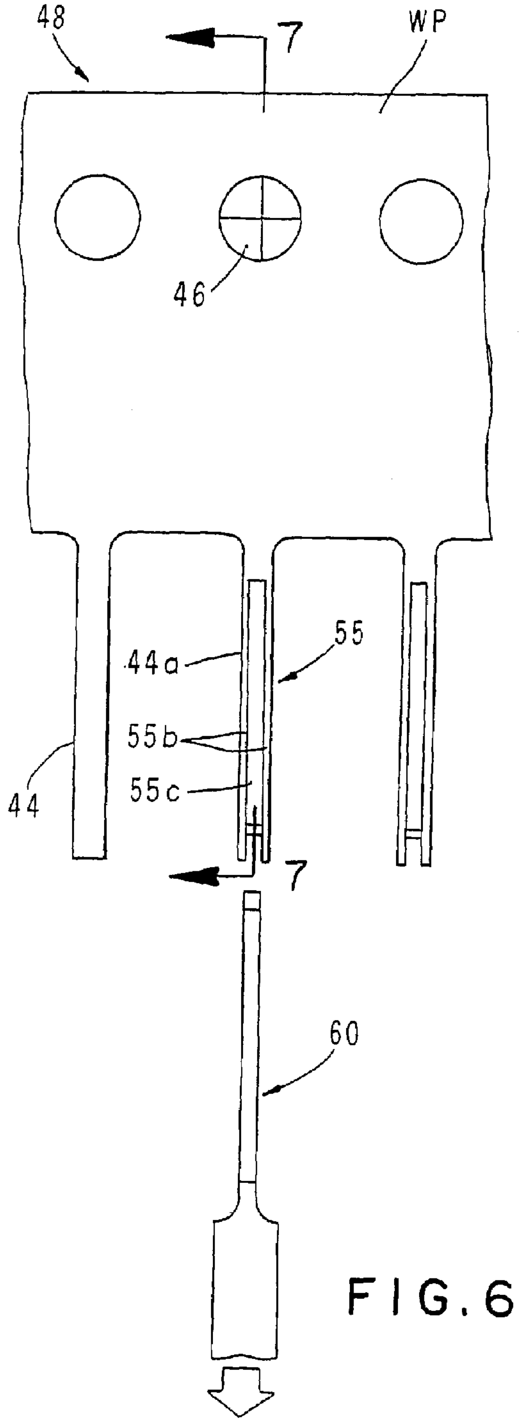
FIG. 6 is a fragmentary top plan view showing removal of the shearing tool from the just formed precursor contact.

As best seen by referring to FIG. 5, shearing tool 60 includes a body portion 60*a* and a cutter portion 60*b* which is integrally formed with body portion 60*a*. Cutter portion 60*b* includes walls 60*c* and 60*d* which taper inwardly and terminate in an apex 60*e* which defines the shearing edge of the shearing tool. Shearing tool 60 preferably has side walls tapering at an angle of between about 60 and about 80 degrees. The shearing tool functions in much the same manner as the earlier described exemplary shearing tool 42 and, as shown in FIGS. 4 and 5, as it moves inwardly of channel 58*a*, precursor top and bottom tongues 55*c* and 55*d* are simultaneously formed into the general configuration shown in FIG. 7 leaving side tongues 55*b* in a spaced-apart configuration. Once again, reference should be made to incorporated by reference U.S. Pat. Nos. 4,909,763 and 4,970,782 for a more detailed discussion of the design requirements for the shearing apparatus shown in FIGS. 3 through 6 and for the details of the shearing step accomplished at the shearing station 48.

Figure 8A:
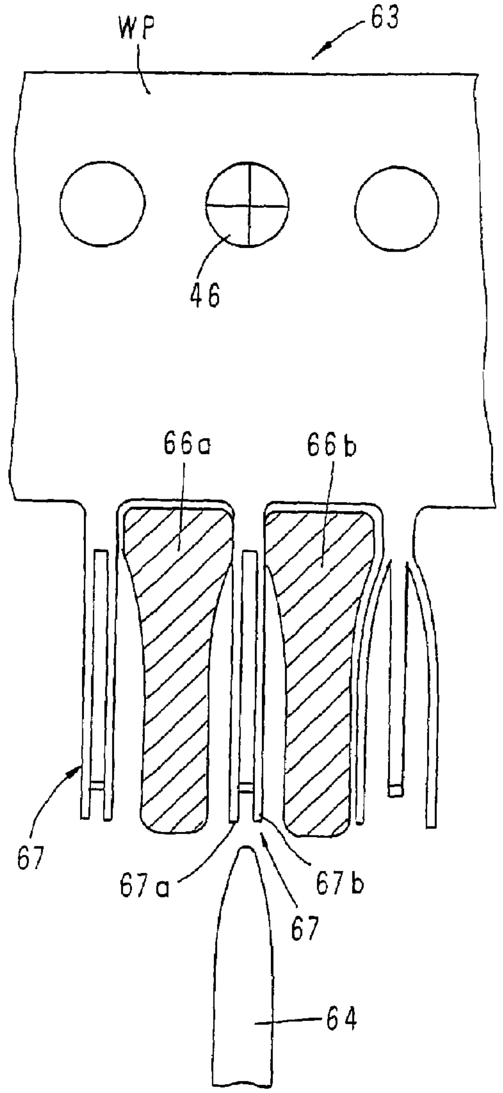
FIG. 8A is a fragmentary, generally diagrammatic top plan view of the tongue spreading station of the apparatus illustrating the first step of the method of the invention for forming the side tongues of the precursor article prior to their being shaped into their final configuration.
Figure 8C:
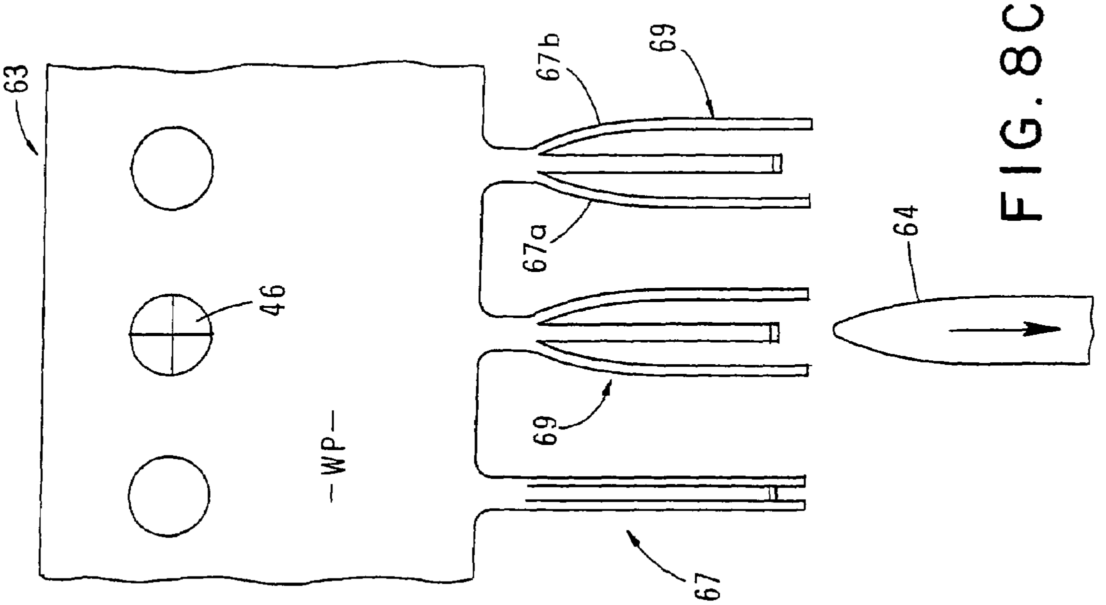
FIG. 8C is a fragmentary generally diagrammatic top plan view similar to FIG. 8B, but showing the spreading tool in a retracted position following spreading of the side tongues.
Figure 8B:
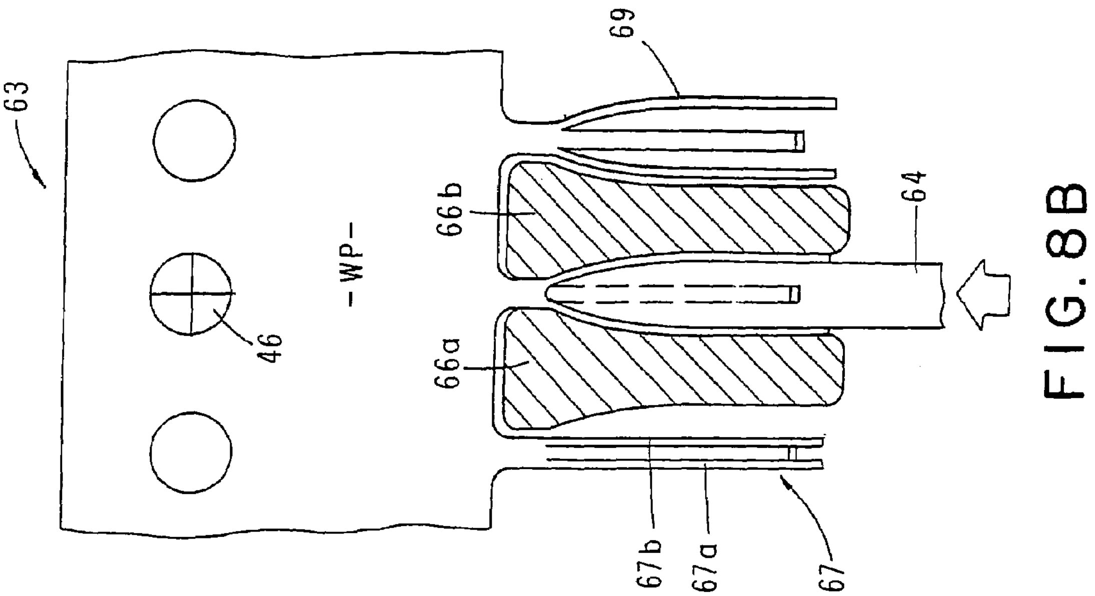
FIG. 8B is a fragmentary, generally diagrammatic top plan view similar to FIG. 8A showing the next step in the side forming operation at the forming station, namely the insertion of the spreading tool between two forming dies.

After shearing of the selected finger 44 is completed, the shearing tool is retracted (FIG. 6) and the precursor electrical contact formed during the shearing operation is advanced forwardly of the apparatus to a forming station 63 having the character generally illustrated in FIGS. 8A, 8B and 8C. In the manner next to be described, during the forming steps of the method of the invention, first forming means acts on the precursor contact to strategically shape the first and second precursor side tongues thereof to form shaped first and second side tongues. This important first forming means here comprises two separate forming mechanisms, the first of which comprises a spreading means located at station 63. This spreading means, which here includes a spreading tool 64 and cooperating backing members 66*a* and 66*b* functions to controllably spread apart and initially shape the precursor side tongues 55*b*. Also forming a part of the first forming means of the apparatus of the invention is a second forming mechanism which, as will presently be discussed, functions to finally shape the precursor side tongues after they have been controllably spread apart by the spreading means.

Considering first the important spreading means of the apparatus, this means here comprises first and second backing members 66*a* and 66*b* which are positioned on either side of a selected precursor electrical contact such as the contact identified in FIG. 8A by the numeral 67. Also forming a part of the spreading means of the invention is the previously mentioned spreading tool 64, which in the manner shown in FIG. 8B, can be advanced between the precursor side tongues 67*a* and 67*b* so as to urge them outwardly to pressural engagement with the inner surfaces of the backing members 66*a* and 66*b*. After the precursor side members have been acted upon by the spreading tool 64, the electrical contact will take on the configuration generally shown in FIG. 8C wherein the partially formed contact is identified by the numeral 69.

Figure 12:
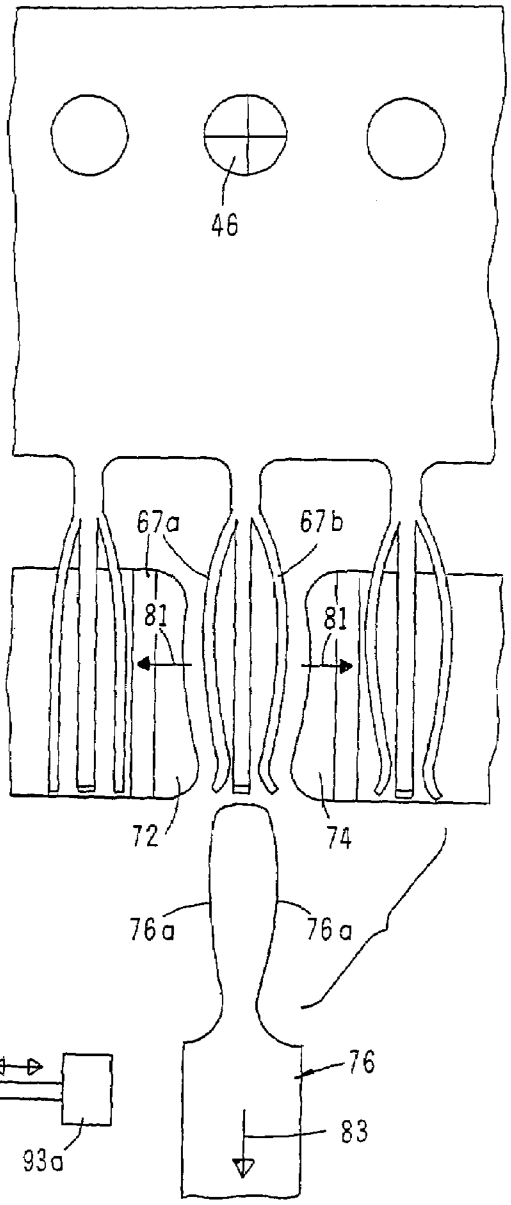
FIG. 12 is a generally diagrammatic top plan view of the tongue shaping station shown in FIG. 11, illustrating the shaping tool of FIG. 11 in a retracted position relative to the formed contact.
Figure 10:
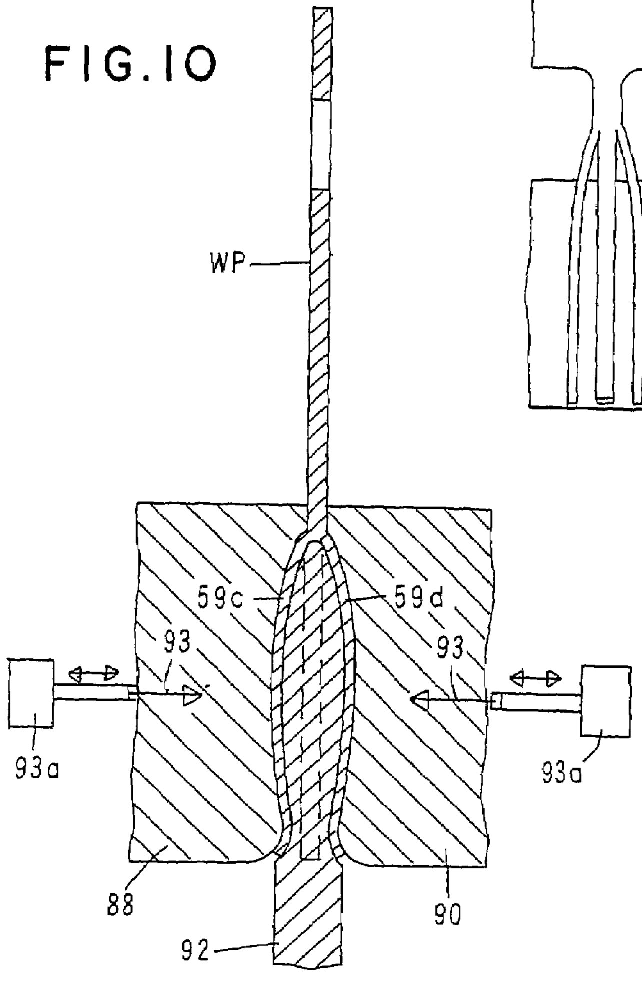
FIG. 10 is a cross-sectional view taken along lines 10—10 of FIG. 9 showing the final shaping step for shaping the top and bottom precursor tongues.
Figure 11:
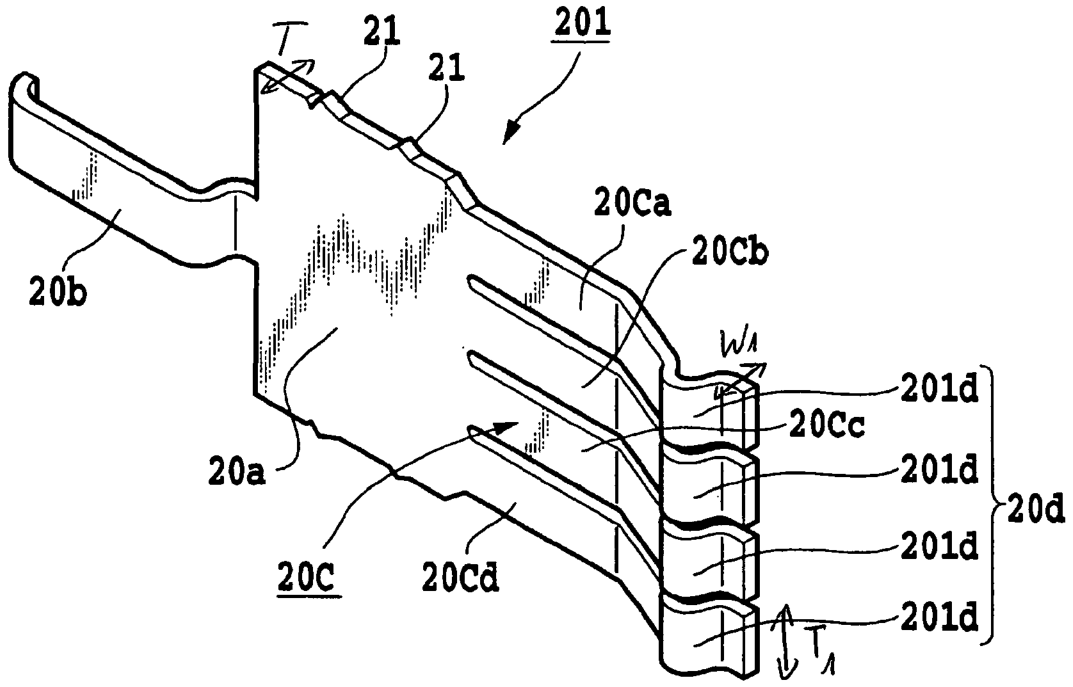
FIG. 11 is a generally diagrammatic, top plan view showing the precursor tongue shaping station for shaping the spaced apart, precursor side tongues of the contact into their final shaped configuration.
Figure 13:
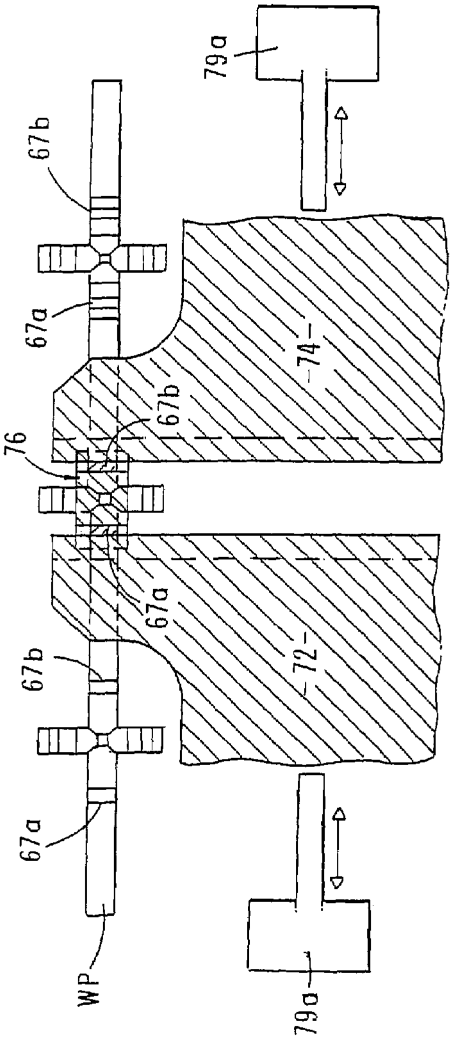
FIG. 13 is a cross sectional view taken along lines 13—13 of FIG. 11.

Turning next to FIGS. 11, 12 and 13, another forming station 70 is there shown. Located at station 70 is the previously mentioned second forming mechanism, which shapes the spread-apart side tongues into their end product configuration. As best seen in FIG. 11, the second forming mechanism, which comprises a part of the first shaping means, includes first and second forming members 72 and 74 which are positioned proximate the spaced apart, precursor side tongues 67*a* and 67*b* of the precursor contact 69. After members 72 and 74 have been moved into the position shown in the left hand portion of FIG. 11, a first forming mandrel 76 is moved inwardly in the direction of the arrow 77 in FIG. 11 to a location intermediate precursor side tongues 67*a* and 67*b*. This done, members 72 and 74 are urged inwardly in the direction of arrows 79 shown in the right-hand portion of FIG. 11 into pressural engagement with the precursor side tongues so as to urge the tongues into forming contact with the curved exterior surfaces 76*a* provided on mandrel 76. The means used for moving the members 72 and 74 into pressural engagement with the precursor side tongues can take several forms well known to those skilled in the art including various types of mechanical means or, for example, hydraulically operated rams 79*a* which move the members in the direction of arrows 79 and which are diagrammatically illustrated in FIG. 13.

Figure 9:
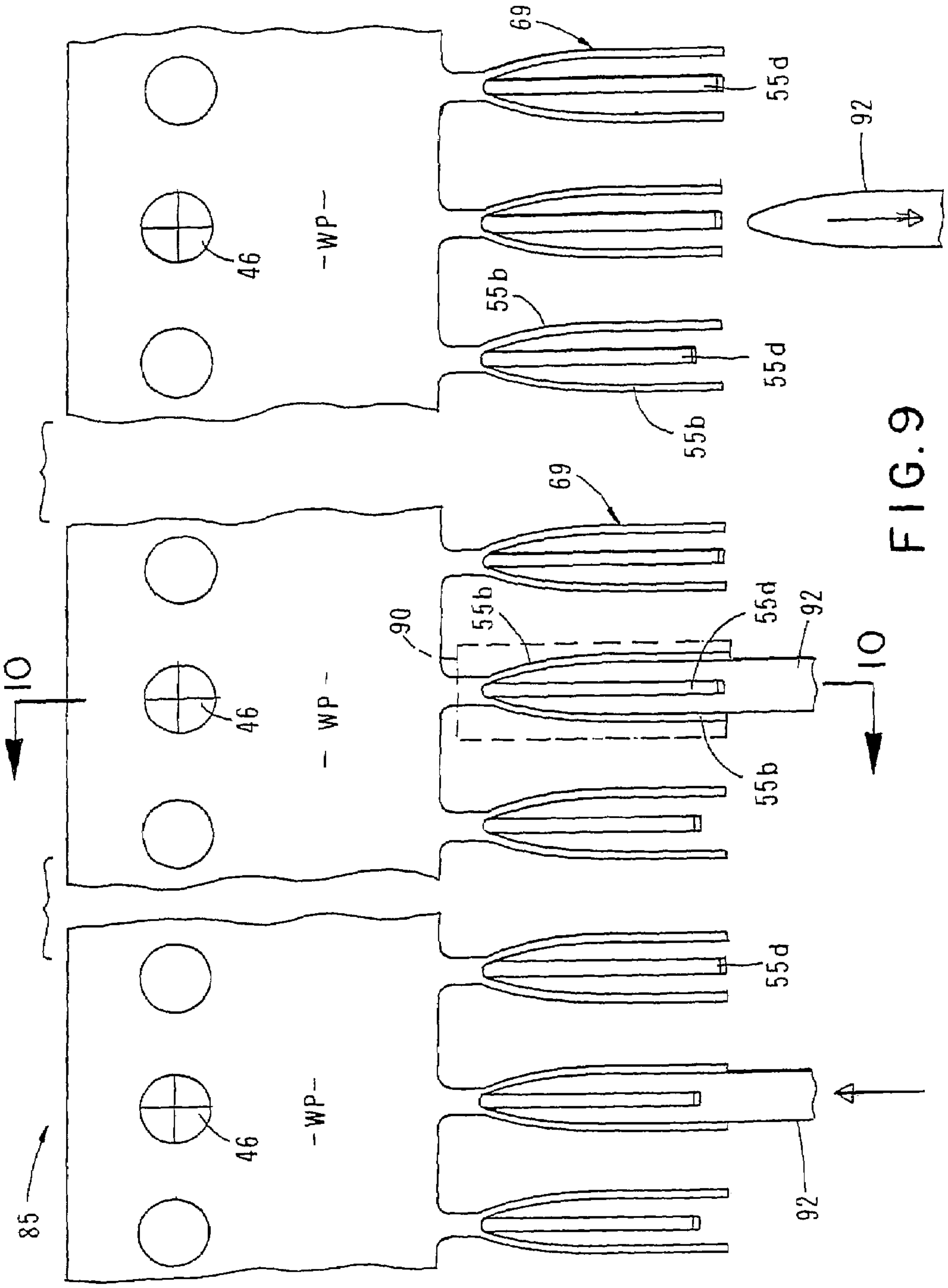
FIG. 9 is a generally diagrammatic top plan view of the precursor tongue shaping stations showing the sequential steps of the method of the invention for shaping the top and bottom tongues of the precursor contact.

Following the final shaping of precursor side tongues 67*a* and 67*b* into their shaped, end product configuration, forming members 72 and 74 are retracted in the direction of arrows 81 of FIG. 12 and forming mandrel 76 is moved outwardly in the direction of the arrow 83 of FIG. 12. Of course, members 72 and 74 are first retracted, and subsequently mandrel 76 is moved outwardly. This sequence of operation permits the formed tongues 67*a* and 67*b* to flex while the mandrel is being removed. It is to understood that forming members 72 and 74 can be moved into proximity with the precursor contact by several types of positioning means of a character well known to those skilled in the art Prior to the final shaping of the precursor side tongues, as described in the preceding paragraph, the top and bottom precursor tongues are shaped by second forming means located at the shaping station 85, the character of which is shown in FIG. 9. This important second forming means acts on the precursor contact to strategically shape the top and bottom precursor tongues. Provided at shaping station 85 are third and fourth, or bottom and top forming members 88 and 90 which are positioned proximate top precursor tongue 55*c* and bottom precursor tongue 55*d* (see also FIGS. 7 and 10). As the forming members 88 and 90 move into the position shown in the central portion of FIG. 9, they will be urged inwardly toward a second forming mandrel 92 which has been advanced to a position interiorly of the precursor tongues of the contact. With forming mandrel 92 in the advanced position, forming members 88 and 90 are next urged inwardly in the direction of the arrows 93 of FIG. 10 into a position wherein the top and bottom precursor tongues are urged into pressural engagement with the curved sides of mandrel 92 so as to shape the top and bottom tongues into their shaped configuration shown in FIG. 10 wherein the shaped tongues are identified by the numerals 59*c* and 59*d*. Once again the means for urging the precursor top and bottom tongues into pressural engagement with the mandrel can take various forms well understood by those skilled in the art and can comprise hydraulic rams 93*a*, as diagrammatically illustrated in FIG. 10, for urging the forming members 88 and 90 in the direction of the arrows 93*c*.

Figure 16:
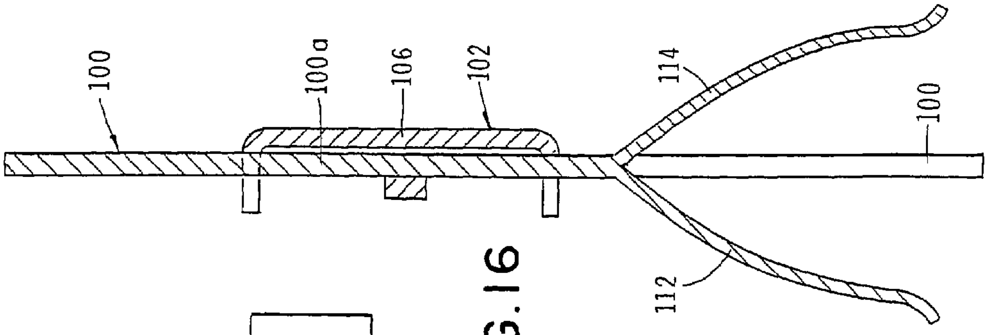
FIG. 16 is a cross-sectional view taken along lines 16—16 of FIG. 14 showing the appearance of the top and bottom tongues following the initial shearing step.
Figure 15:
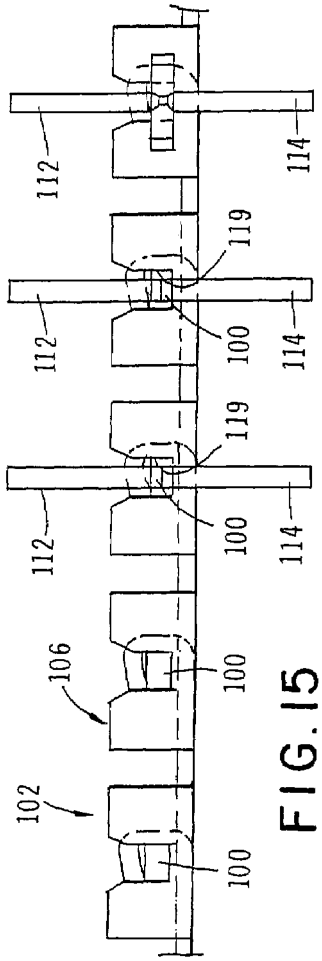
FIG. 15 is a front view of a portion of the apparatus and workpiece shown in FIG. 14 illustrating the method of shearing the alternate form of starting workpiece.
Figure 14:
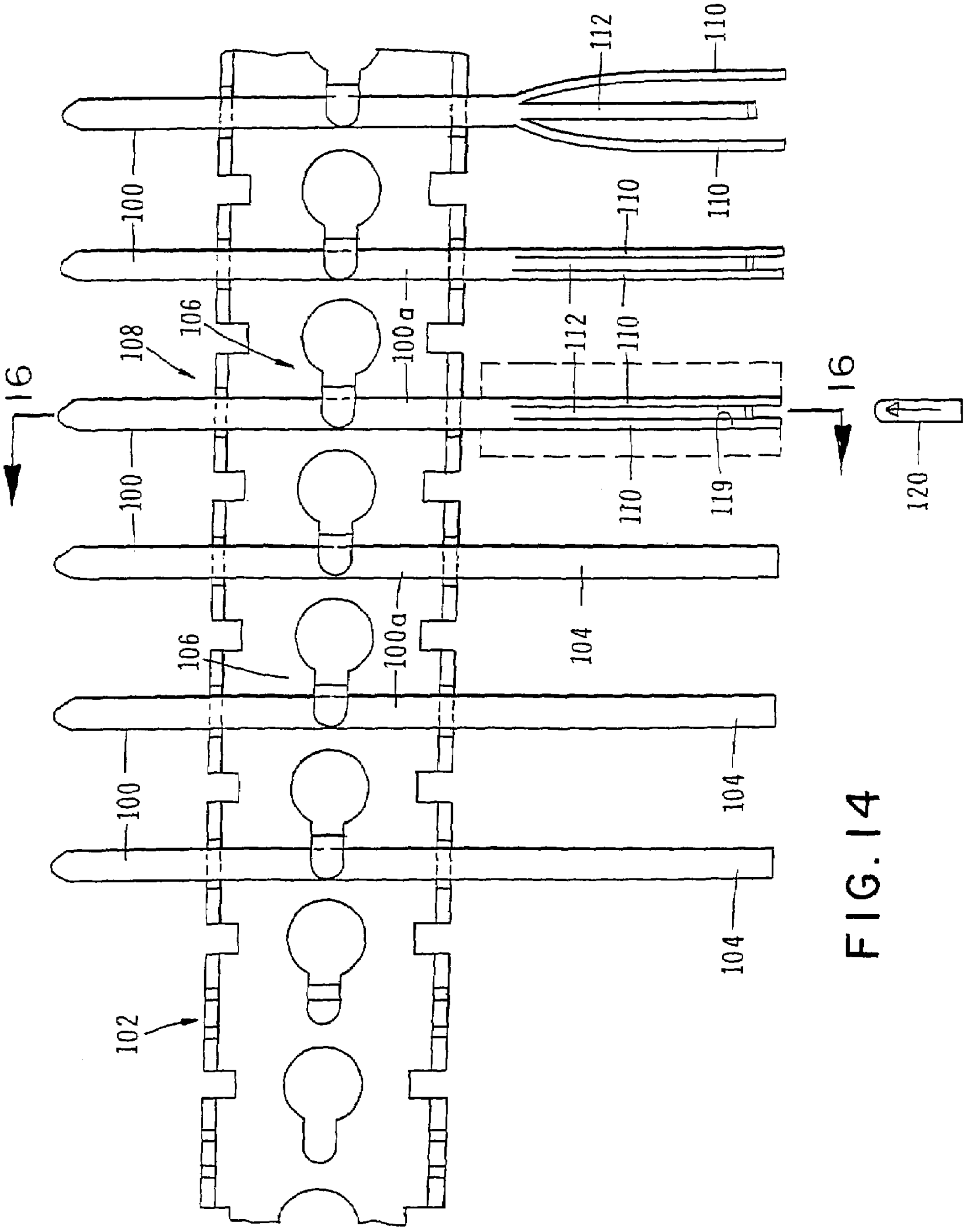
FIG. 14 is a generally diagrammatic top plan view showing an alternate form of the apparatus of the invention and depicting the steps of an alternate method of the invention for shearing a workpiece of a somewhat different construction.

Referring next to FIGS. 14, 15 and 16 an alternate apparatus of the invention for making four sided electrical contacts is there illustrated. This apparatus is similar in many respects to the apparatus of the invention previously described and is uniquely adapted to shear an alternate form of workpiece into a precursor contact having precursor side tongues and precursor top and bottom tongues. The workpiece here comprises an elongated, pin-like member 100 having a predetermined width and a predetermined thickness. The workpieces, or pin-like members 100 are affixed to a bandolier strip 102 of a character well known to those skilled in the art which has the configuration generally illustrated in FIG. 14.

Referring to FIG. 16, it can be seen that the stem portion 100*a* of the starting workpiece 100 is securely clamped to bandolier strip 102 by a clamping yoke 106. After the starting pin 100 is securely clamped to the bandolier strip in a manner shown in the drawings, the strip is moved toward the shearing station generally designated by the numeral 108 where the shearing step is accomplished. Shearing station 108 is substantially similar to the previously described shearing station 48 and at this important shearing station a selected pin 100 is controllably sheared to produce a four sided, precursor contact of the general configuration illustrated in FIG. 16 having a stem portion 160*a* that is equal in width and thickness to pin 100. Following the shearing step, the precursor contact thus formed includes a stem portion 100*a*, spaced apart precursor side tongues 110 and precursor top and bottom tongues 112 and 114 respectively.

During the shearing step a selected pin 100 is securely clamped between cooperating upper and lower clamping elements 118 which comprise a part of the support means of this alternate form of the apparatus of the invention. As before, clamping elements 118 are each provided with a shearing tool receiving channel 119 which is of a width less than the width of pin 100.

With the selected pin 100 securely clamped in place between upper and lower support members 118 and shearing tool receiving channels 119 in a manner shown in the center portion of FIG. 14, shearing means here provided in the form of a shearing tool or punch 120, is controllably moved toward channels 119. As the shearing tool enters channels 119, it will cleanly shear the central portion of the pin in a manner to form the precursor contact, which is of the general configuration illustrated in FIG. 16. Following the shearing step, shearing tool 120 is retracted and the bandolier strip 102 is moved to the right carrying the precursor contacts 104 with it.

Following the shearing step, the precursor contacts are transported by the bandolier strip toward the first and second forming means of the invention which are of substantially identical construction and operation to those previously described herein.

As was discussed in incorporated by reference U.S. Pat. No. 4,909,763, in some instances the shearing of the starting work pierces WP and 100 causes a "plowing" like effect occurs on the material as the shearing tool advances. This "plowing" like effect can result in the increase in thickness of the tongues and the concomitant shortening thereof. Stated another way, an examination of the top and bottom tongues formed in the shearing process reveals that in some instances they have become thicker than one-half the thickness of the workpiece 100 and stem portion **100*a* of the contact. Accordingly, if the top and bottom tongues were to be bent inwardly toward one another, their overall length would be less than the length of the unsupported area of the starting workpiece. The reasons for this thickening of the tongue walls as well as the foreshortening effect is discussed in detail in columns 9 and 10 of incorporated by reference U.S. Pat. No. 4,909,763 and will not be repeated here. Suffice to say that in some cases the thickness of the upper and lower tongues can vary from between about 50% of the thickness of the workpiece "WP" and stem 100*a*** and about 60% of this thickness. The thickness of the tongues is, of course, at least equal to 50% the thickness of the workpiece and stem.

Turning to FIGS. 18 through 21, the steps of still another method for making electrical contacts is there illustrated. The apparatus depicted in these drawings is virtually identical to the apparatus of the invention shown in FIGS. 3 through 13 as previously described herein. However, in this instance, the apparatus is uniquely adapted to shear a tapered finger of a workpiece "WT" into a precursor contact having precursor side tongues and precursor top and bottom tongues.

Figure 19:
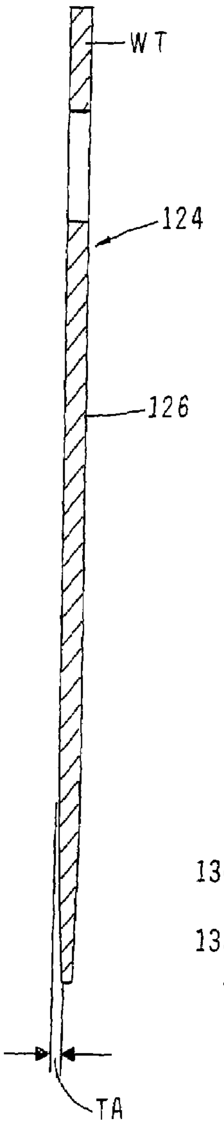
FIG. 19 is a cross-sectional view taken along lines 19—19 of FIG. 17 showing the configuration of the tapered workpiece.

As best seen in FIG. 19, the workpiece "WT" here comprises an elongated strip of material 124 having a plurality of outwardly extending fingers 126 which are tapered in cross-section in the manner indicated in FIG. 19. The advantages of using this novel tapered workpiece are discussed in the paragraph that follows:

Experience has shown that, while the prior art, uniform-thickness, beam-type contacts of the character described in U.S. Pat. Nos. 4,909,763 and 4,970,782 issued to the present inventor are well suited for most applications, such contacts exhibit an inherent drawback. More specifically, these types of contacts, that have a uniform thickness beam supported at one end, undesirably exhibit maximum bending stress at the point of support that is proximate the end of the split or shear. By making the starting workpiece finger in a tapered configuration in which the finger tapers from a lesser thickness proximate its free distal end to a greater thickness proximate its proximal fixed end, the stress of the fixed end can be markedly reduced and the tendency of the bending stress to propagate the shear considerably lessened.

Figure 17:
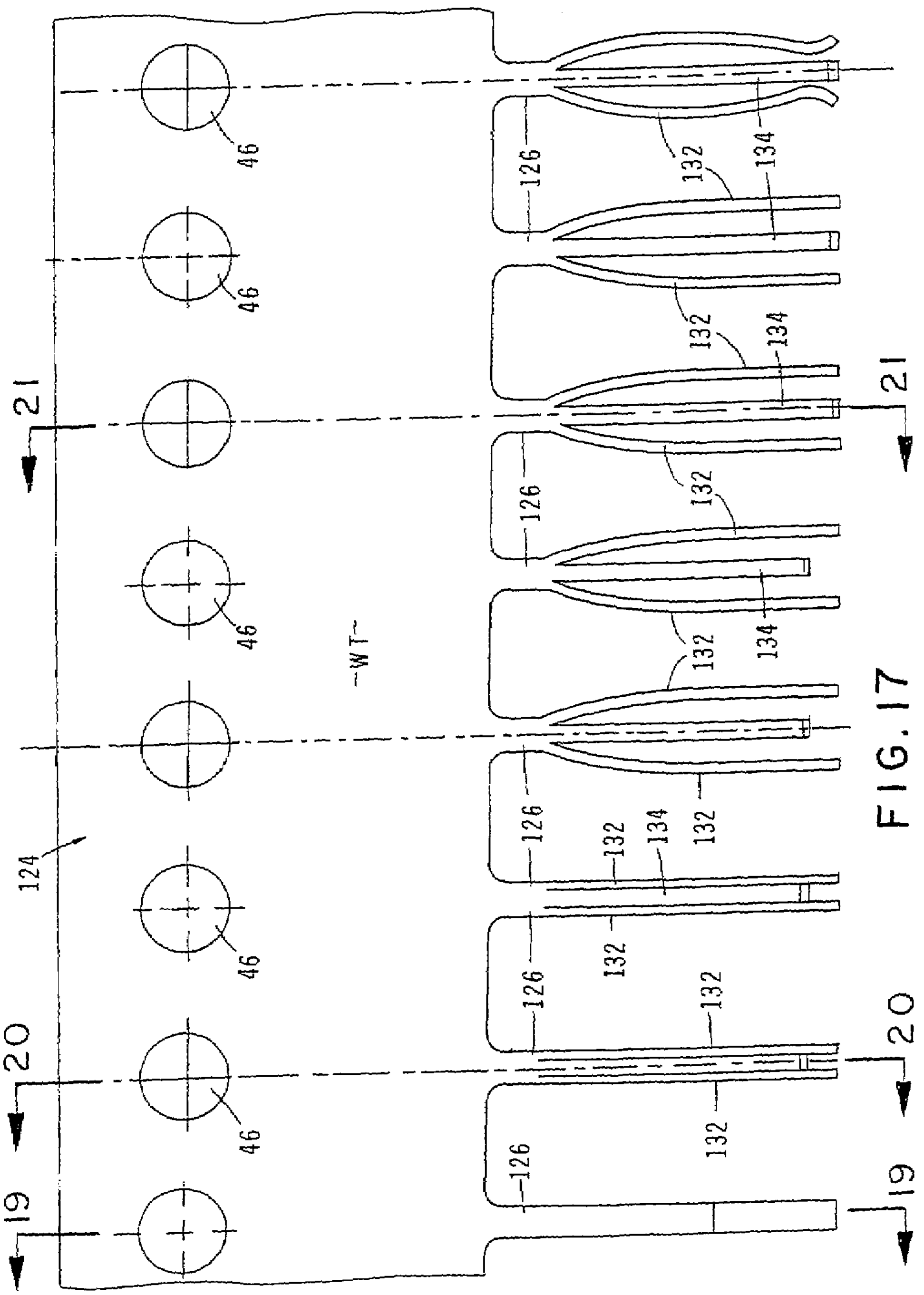
FIG. 17 is a generally diagrammatic top plan view showing still another form of the apparatus of the invention and depicting the steps of the method of the invention for shearing a tapered workpiece.
Figure 18:
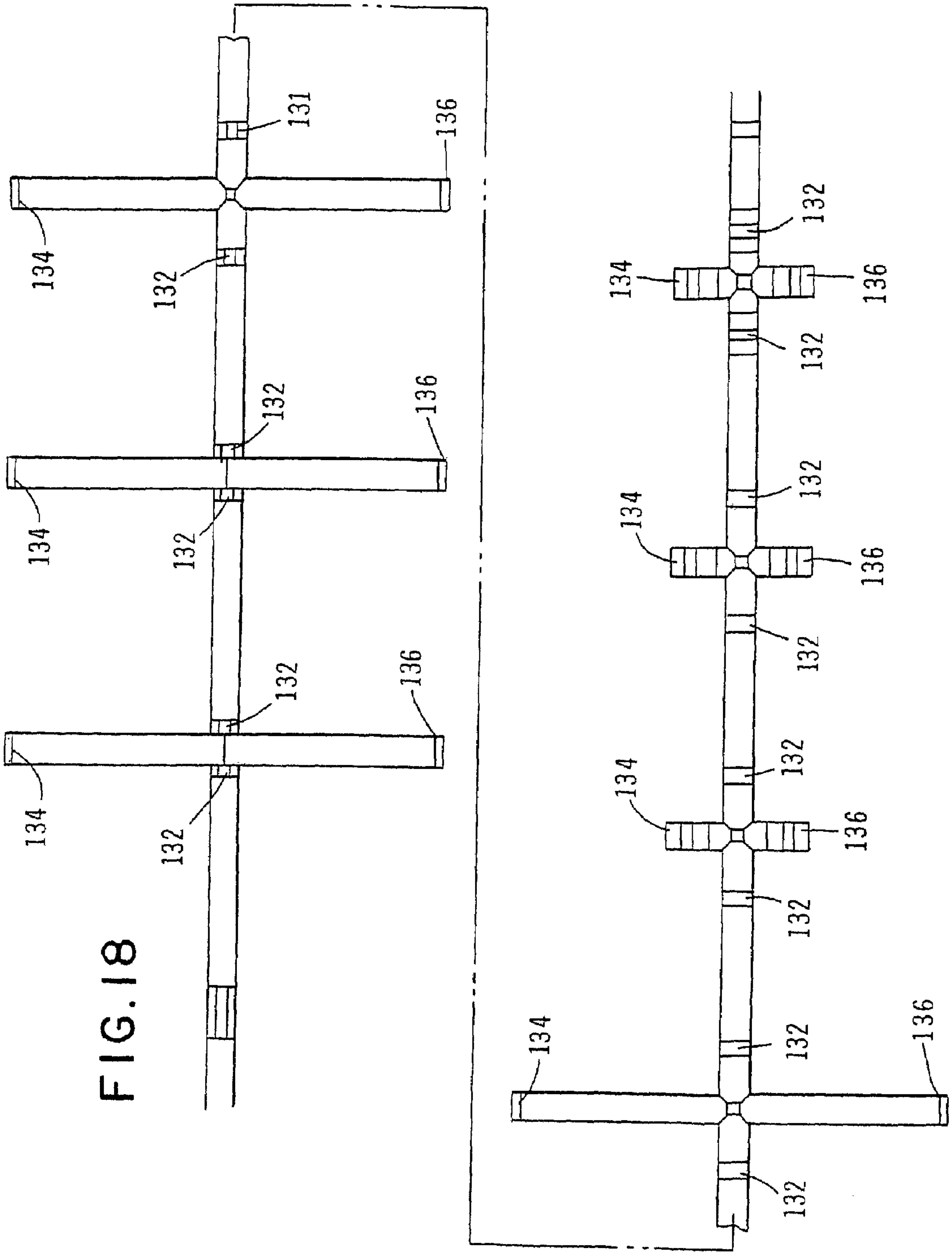
FIG. 18 is a front view of a portion of the apparatus and workpiece shown in FIG. 17 illustrating the method of shearing the alternate form of starting workpiece.

Referring to FIGS. 17 and 18, the apparatus there depicted is used to form the improved contact as described in the preceding paragraph. As previously mentioned, this apparatus is substantially identical to that shown in FIGS. 3 through 13 and like numerals are used in FIGS. 17 through 21 to identify like components. In using the apparatus to form the improved tapered tongue contacts of the invention, the starting workpiece "WT" is first indexably positioned on the work surface of the apparatus in the manner previously described using index pins 46. This done, the workpiece is advanced to the shearing station, generally identified by the numeral 48, where the shearing step is accomplished in the manner previously described. It should, of course, be noted that blocks 40 must have surfaces in their clamping channels that match the top and bottom surfaces of the fingers.

Figure 20:
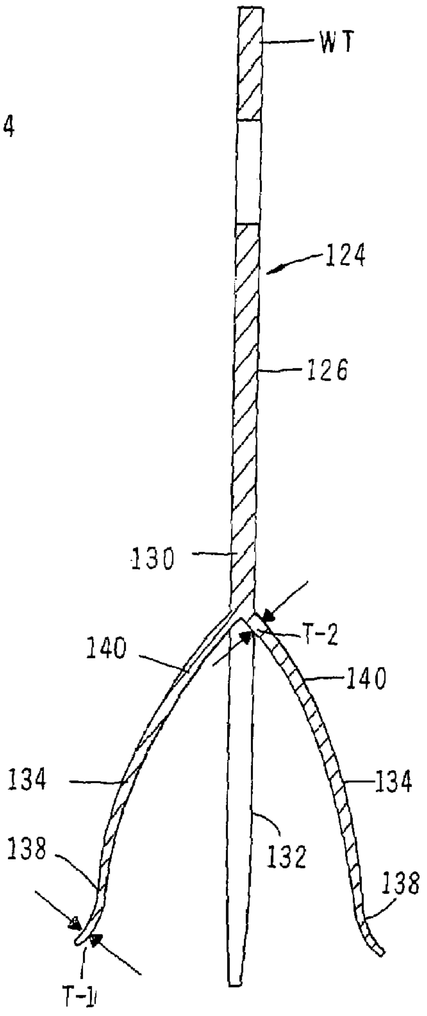
FIG. 20 is a cross-sectional view taken along lines 20—20 of FIG. 17 showing the appearance of the top and bottom tongues following the initial shearing of the tapered workpiece.

After the shearing step is completed, each individual precursor contact that is formed includes a stem portion 130 which, at this stage, is a part of a finger 126 of strip "WT". Extending from stem portion 130 are spaced apart precursor side tongues 132 (FIG. 18), a tapered precursor top tongue 134 and a tapered precursor bottom tongue 136 (FIG. 20). Each of these top and bottom precursor tongues has a distal, first portion 138 of a first thickness "T-1" and a second, proximal portion 140 of a second thickness "T-2" greater than the first thickness.

As before, in using the apparatus of this latest form of the invention, which is generally depicted in FIGS. 17 and 18, the workpiece is sequentially advanced to the right as seen in FIG. 17, first to the shearing work station 48 and then through the several previously described forming and shaping stations where the precursor tongues are strategically formed into their final shape.

Figure 21:
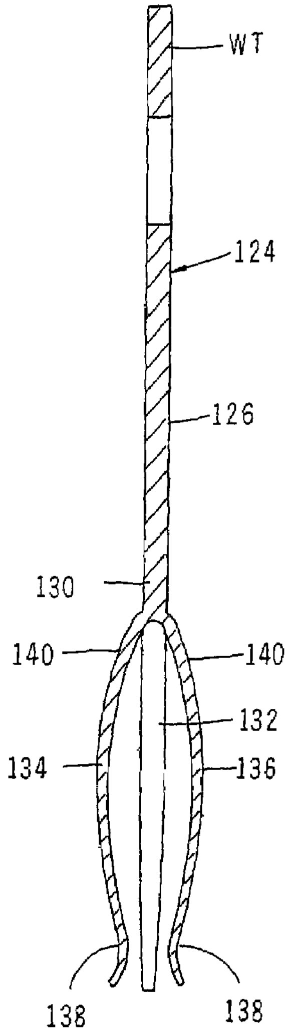
FIG. 21 is a cross-sectional view taken along lines 21—21 of FIG. 17 showing the appearance of the top and bottom tongues after the initial forming step.
Figure 11:
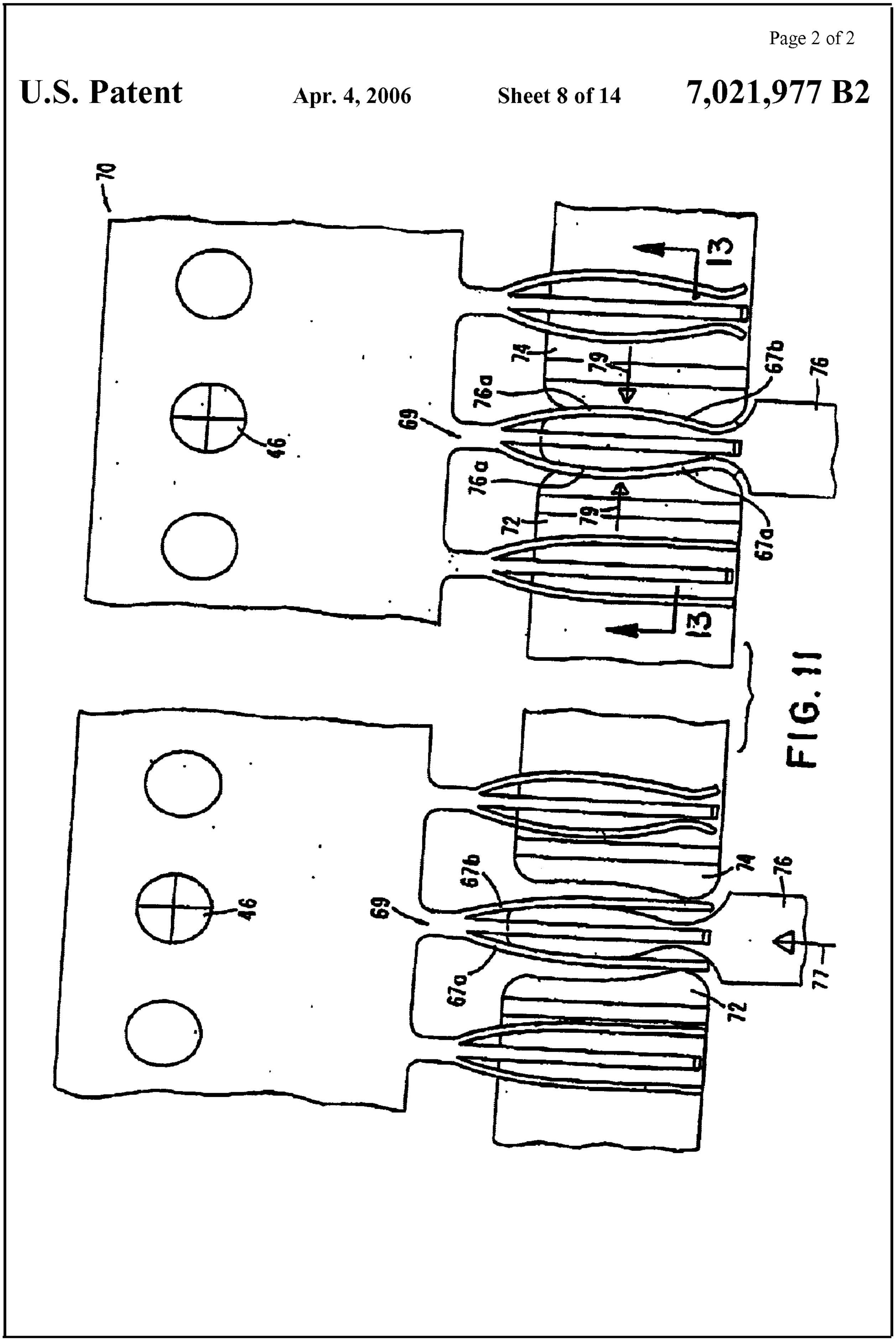

After the shearing step has been completed, the two precursor side tongues 132 and the precursor top and bottom tongues 134 and 136 respectively will have the novel tapered configuration shown in FIGS. 20 and 21 wherein the tongues are thicker at their fixed or proximal ends and become thinner in a direction toward their free or distal ends. As earlier discussed, this unique tapered construction will reduce stress at the fixed proximal end thereby lessening the tendency of the shear to propagate.

Referring again to FIGS. 17 and 18, following the initial shearing step at station 48 and the subsequent retraction of the shearing tool, the workpiece "WT" will be advanced to the right in a direction toward the spreading means located at station 63 wherein the precursor side tongues of the precursor contact will be shaped in the manner previously described. Next, the workpiece will be advanced to the forming station 85 where, in the manner previously described, the top and bottom tongues will be shaped into their end product configuration wherein the product exhibits its novel tapered tongue configuration illustrated in FIGS. 20 and 21.

Referring to FIGS. 22 through 24, the apparatus used to form still another form of improved contact is there illustrated. This apparatus is substantially identical to that shown in FIGS. 17 and 18 and like numerals are used in FIGS. 22 through 24 to identify like components. In using the apparatus to form this latest form of improved contacts of the invention, the starting workpiece, here identified as WP-1, is first indexably positioned on the work surface of the apparatus in the manner previously described using index pins 46. This done, the workpiece is advanced to the shearing station, where the shearing step is accomplished also in the manner previously described. It is to be noted that in this instance the workpiece WP-1 includes a plurality of spaced apart fingers 150 each of which varies in width from a first width W-1, proximate its free end, to a second greater width W-2 proximate its fixed end (FIG. 22). (The variation in width shown in the drawings is somewhat exaggerated for purposes of illustration.) As depicted in FIG. 23, each of the fingers 150 also varies in thickness from a lesser thickness proximate its free end to a greater thickness proximate its fixed end. As in the earlier described embodiments of the invention, in actual operation, the workpiece is sequentially advanced to the right as seen in FIG. 22, first to the shearing work station 48 and then through the several previously described forming and shaping stations where the precursor tongues are strategically formed into their final shape.

After the shearing step has been completed, the two precursor side tongues 152 and the precursor top and bottom tongues 154 and 156 not only vary in width, but also, as shown in FIG. 24, vary in thickness with the tongues being thicker at their fixed or proximal ends thinner in a direction toward their free or distal ends. As previously discussed, by making the starting workpiece finger in a tapered and variable width configuration as shown in FIGS. 22 and 23, the stresses at the fixed end of the formed contacts can be markedly reduced and the tendency of the bending stress to propagate the shear considerably lessened.

Having now described the invention in detail in accordance with the requirements of the patent statutes, those skilled in this art will have no difficulty in making changes and modifications in the individual parts or their relative assembly in order to meet specific requirements or conditions. Such changes and modifications may be made without departing from the scope and spirit of the invention, as set forth in the following claims.

I claim:

1. An electrical contact formed from a single sheet flat material of a predetermined thickness comprising:

(a) a stem having a stem thickness;

(b) first and second side tongues connected to said stem and extending angularly outwardly therefrom, each of said side tongues having a first width and a first thickness less than said stem thickness; and (c) top and bottom tongues connected to said stem, each of the top and bottom tongues extending angularly outwardly from said stem and having a thickness less than said stem thickness.

2. The electrical contact as defined in claim 1 in which said first width of each of said side tongues is substantially equal to said stem thickness.

3. The electrical contact as defined in claim 1 in which said first thickness of each of said side tongues is substantially one-half of said stem thickness.

4. The electrical contact as defined in claim 1 in which each of said top and bottom tongues are generally arcuate in shape.

5. The electrical contact as defined in claim 4 in which each of said top and bottom tongues have a thickness of about 50% to 60% of said stem thickness.

* * * * *

UNITED STATES PATENT AND TRADEMARK OFFICE

CERTIFICATE OF CORRECTION

PATENT NO. : 7,021,977 B2 
APPLICATION NO. : 10/890577
DATED : April 4, 2006
INVENTOR(S) : Stephen Andersen It is certified that error appears in the above-identified patent and that said Letters Patent is hereby corrected as shown below:

In the drawings delete Figure 11 and substitute Figure 11 with attached sheet.

Signed and Sealed this

Tenth Day of October, 2006

JON W. DUDAS
*Director of the United States Patent and Trademark Office*